(12) United States Patent
Nishino et al.

(10) Patent No.: US 7,279,427 B2
(45) Date of Patent: Oct. 9, 2007

(54) DAMAGE-FREE ASHING PROCESS AND SYSTEM FOR POST LOW-K ETCH

(75) Inventors: Masaru Nishino, Cambridge, MA (US); Douglas M Trickett, Boise, ID (US)

(73) Assignee: Tokyo Electron, Ltd., Tokyo (JP)

( * ) Notice: Subject to any disclaimer, the term of this patent is extended or adjusted under 35 U.S.C. 154(b) by 0 days.

(21) Appl. No.: 11/195,854

(22) Filed: Aug. 3, 2005

(65) Prior Publication Data
US 2007/0032087 A1   Feb. 8, 2007

(51) Int. Cl.
*H01L 21/302* (2006.01)
(52) U.S. Cl. ............... 438/706; 438/710; 438/711
(58) Field of Classification Search ............ 438/706, 438/710, 711, 725
See application file for complete search history.

(56) References Cited

U.S. PATENT DOCUMENTS

| | | | |
|---|---|---|---|
| 5,888,337 A | 3/1999 | Saito | |
| 2002/0058397 A1* | 5/2002 | Smith et al. | 438/475 |
| 2004/0180269 A1 | 9/2004 | Balassubramaniam | |
| 2004/0185380 A1 | 9/2004 | Igarashi | |
| 2005/0029229 A1* | 2/2005 | Chae et al. | 216/67 |
| 2006/0051947 A1* | 3/2006 | Lin et al. | 438/597 |
| 2006/0138399 A1* | 6/2006 | Itano et al. | 257/40 |

* cited by examiner

*Primary Examiner*—Hsien-Ming Lee
(74) *Attorney, Agent, or Firm*—DLA Piper US LLP (57) ABSTRACT

A process is provided for substrate ashing following the etching of features in a low dielectric constant (low-k) layer. The low-k layer can include ultra-low-k material, or a porous low-k material. The process may be configured to remove etch byproducts while preserving feature critical dimension. The ashing process comprises the use of a nitrogen and hydrogen containing chemistry with a passivation chemistry that includes oxygen, such as $O_2$, CO, or $CO_2$, or any combination thereof.

12 Claims, 7 Drawing Sheets

DAMAGE-FREE ASHING PROCESS AND SYSTEM FOR POST LOW-K ETCH

CROSS-REFERENCE TO RELATED APPLICATIONS

This application is related to U.S. application Ser. No. 10/736,782, entitled "Method and apparatus for bilayer photoresist dry development", filed on Dec. 17, 2003; and U.S. application Ser. No. 10/640,577, entitled "Method and apparatus for multilayer photoresist dry development" filed on Aug. 14, 2003. The entire contents of all of these applications are herein incorporated by reference in their entirety.

FIELD OF THE INVENTION

The present invention relates to a method and system for removing post-etch residue on a substrate using a dry plasma process, and more particularly to a method and system for performing a damage-free removal of post-etch residue on a low dielectric constant (low-k) layer, wherein the dielectric constant of the low-k layer is less than the dielectric constant of $SiO_2$.

BACKGROUND OF THE INVENTION

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes. While low-k materials are promising for fabrication of semiconductor circuits, the present inventors have recognized that these films also provide many challenges. First, low-k films tend to be less robust than more traditional dielectric layers and can be damaged during wafer processing, such as by etch and plasma ashing processes generally used in patterning the dielectric layer. Further, some low-k films tend to be highly reactive when damaged, particularly after patterning, thereby allowing the low-k material to absorb water and/or react with other vapors and/or process contaminants that can alter the electrical properties of the dielectric layer. As a result, the low-k material, originally having a low dielectric constant, suffers damage leading to an increase in its dielectric constant and a loss of its initially intended benefit. At present, the removal of post-etch residue from advanced semiconductor devices having low-k layers has been facilitated by the exposure of these layers to a dry plasma ashing process. In particular, the dry plasma utilizes an oxygen-based chemistry; however, it has been observed that conventional oxygen plasma damages the low-k layer as described above. As an alternative, nitrogen, hydrogen and ammonia-based chemistries have been investigated, but these chemistries have demonstrated poor etch selectivity to the etch stop layer underlying the low-k layer. The removal of the etch stop layer during plasma ashing can lead to potential semiconductor device damage.

SUMMARY OF THE INVENTION

The present invention relates to a method for removing post-etch residue on a substrate using a dry plasma process. In particular, the present invention relates to a method for performing a damage-free removal of post-etch residue on a low dielectric constant (low-k) layer, wherein the dielectric constant of the low-k layer is less than the dielectric constant of $SiO_2$.

According to an embodiment, a method of removing post-etch residue from a substrate is described. The substrate having a dielectric layer is disposed in a plasma processing system, wherein the dielectric layer has a dielectric constant value less than the dielectric constant of $SiO_2$, the dielectric layer has a feature formed therein using an etching process, and wherein the feature has the post-etch residue formed thereon by the etching process. A process gas comprising a nitrogen containing gas, a hydrogen containing gas, and an oxygen containing gas, wherein the oxygen containing gas comprises oxygen ($O_2$), CO, or $CO_2$, or any combination thereof is introduced. A plasma is formed from the process gas in the plasma processing system. The substrate is exposed to the plasma in order to remove the post-etch residue.

According to another embodiment, a method of removing post-etch residue from a substrate is described. The substrate having a dielectric layer is disposed in a plasma processing system, wherein the dielectric layer has a feature formed therein using an etching process and the feature has the post-etch residue formed thereon by the etching process, and wherein the dielectric layer has a dielectric constant value less than the dielectric constant of $SiO_2$. A process gas comprising a nitrogen containing gas, a hydrogen containing gas, and an oxygen containing gas, wherein the oxygen containing gas comprises CO, or $CO_2$, or any combination thereof is introduced. A plasma is formed from the process gas in the plasma processing system. The substrate is exposed to the plasma in order to remove the post-etch residue while causing an insubstantial change in the dielectric constant value of the dielectric layer.

According to yet another embodiment, a plasma processing system for removing post-etch residue from a feature in a dielectric layer on a substrate is described. The system includes a plasma processing chamber for facilitating the formation of a plasma from a process gas in order to remove the post-etch residue from the feature and a controller coupled to the plasma processing chamber and configured to execute a process recipe utilizing the process gas. The process gas comprises a nitrogen containing gas, a hydrogen containing gas, and an oxygen containing gas, wherein the oxygen containing gas comprises CO, or $CO_2$, or $O_2$, or any combination thereof. The dielectric layer has a dielectric constant value less than the dielectric constant of $SiO_2$, and the removal of the post-etch residue causes an insubstantial change in the dielectric constant value of the dielectric layer.

DETAILED DESCRIPTION OF SEVERAL EMBODIMENTS

In material processing methodologies, pattern etching comprises the application of a thin layer of light-sensitive material, such as photoresist, to an upper surface of a substrate, that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Figure 1A:
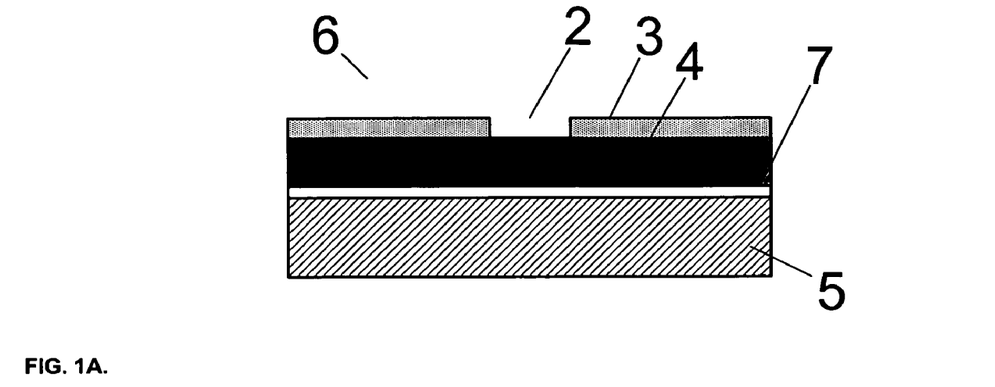
FIGS. 1A, 1B, and IC show a schematic representation of a typical procedure for pattern etching a thin film.
Figure 1B:
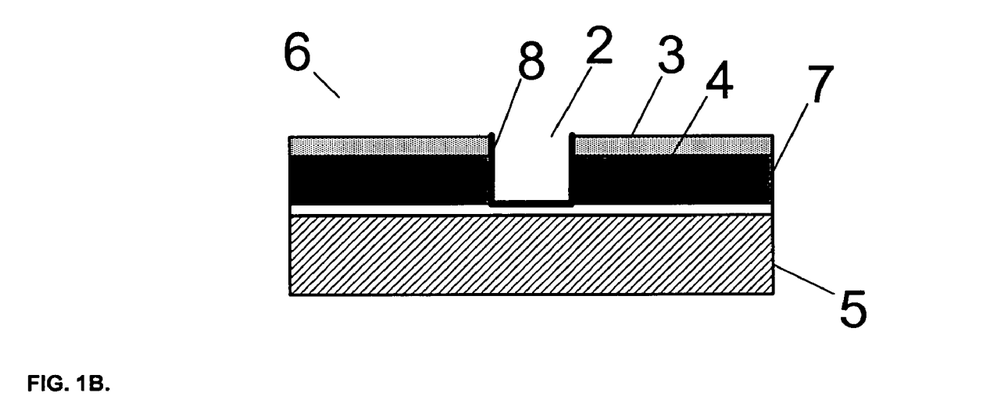
Figure 1C:
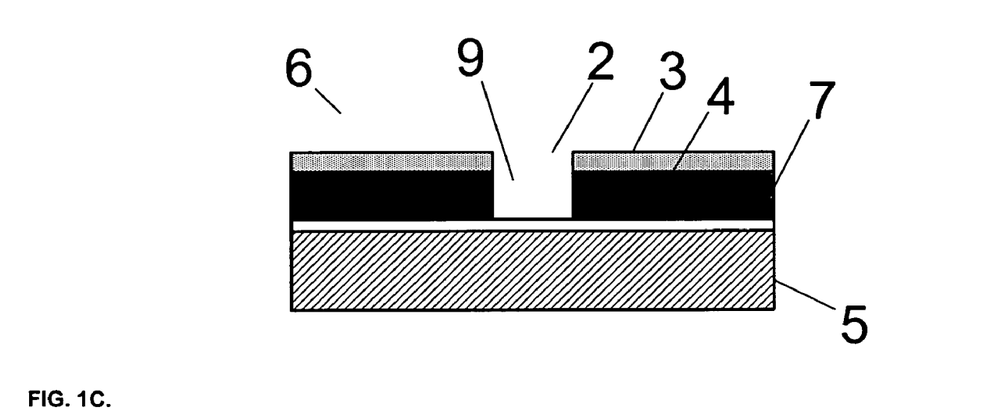

For example, as shown in FIGS. 1A-C, an etching mask 6 comprising light-sensitive layer 3 with pattern 2 formed using conventional lithographic techniques can be utilized as a mask for etching a dielectric layer 4, wherein the mask pattern 2 in the light-sensitive layer 3 is transferred to the dielectric layer 4 using an etching process. An etch stop layer 7 may be employed to facilitate the end of the etching process while preventing the etching process from penetrating the underlying layers of substrate 5. For example, the etch stop layer can include silicon nitride or silicon carbide for silicon processing. Once the etching process is performed, remnants of the light-sensitive material and post-etch residue 8 are left on surfaces of feature 9.

Following the etching process, post-etch residue is removed. Conventionally, as described above, an oxygen plasma is utilized to remove such residue; however, it has been observed that these conventional processes damage the dielectric layer and, in many cases, cause an increase in the dielectric constant of the layer. In advanced semiconductor devices, dielectric layers comprise low-dielectric constant (low-k) materials. For example, the dielectric constant value of the dielectric layer is less than the dielectric constant of $SiO_2$, which is approximately 4 (e.g., the dielectric constant for thermal silicon dioxide can range from 3.8 to 3.9). Alternatively for example, the dielectric constant value can be less than 2.5. For instance, the dielectric layer may be characterized as an ultra-low-k material.

The dielectric layer may include at least one of an organic, inorganic, and inorganic-organic hybrid material. Additionally, the dielectric layer may be porous or non-porous. For example, the dielectric layer may include an inorganic, silicate-based material, such as oxidized organosilane (or organo siloxane), deposited using CVD techniques. Examples of such layers include Black Diamond™ CVD organosilicate glass (OSG) films commercially available from Applied Materials, Inc., or Coral™ CVD films commercially available from Novellus Systems. Additionally, porous dielectric layers can include single-phase materials, such as a silicon oxide-based matrix having $CH_3$ bonds that are broken during a curing process to create small voids (or pores). Additionally, for example, porous dielectric layers can include dual-phase materials, such as a silicon oxide-based matrix having pores of organic material (e.g., porogen) that is evaporated during a curing process. Alternatively, the dielectric layer may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric layer can include an organic material deposited using SOD techniques. Examples of such films include SiLK-I, SiLK-J, SiLK-H, SiLK-D, and porous SiLK semiconductor dielectric resins commercially available from Dow Chemical, and FLARE™, and Nano-glass commercially available from Honeywell.

In one embodiment, a process for removing post-etch residue from a dielectric layer utilizing a process gas comprising a nitrogen (N) containing gas, a hydrogen (H) containing gas, and an oxygen (O) containing gas is described. Alternatively, two or more of nitrogen (N), hydrogen (H), and oxygen (O) can be included in a single gas. For example, an ammonia-oxygen ($NH_3/O_2$) based chemistry can be introduced as a method of removing post-etch residue from a low-k dielectric layer. In an alternate embodiment, a nitrogen-hydrogen-oxygen ($N_2/H_2/O_2$) based chemistry can be employed to remove post-etch residue from a low-k dielectric layer. Alternately, carbon monoxide (CO) can be added, or utilized to replace $O_2$ in the former two chemistries. Alternately, carbon dioxide ($CO_2$) can be added, or utilized to replace $O_2$ in the former three chemistries. Alternately, the process gas can further comprise an inert gas, such as a noble gas (i.e., helium, neon, argon, krypton, xenon, etc.).

Figure 2:
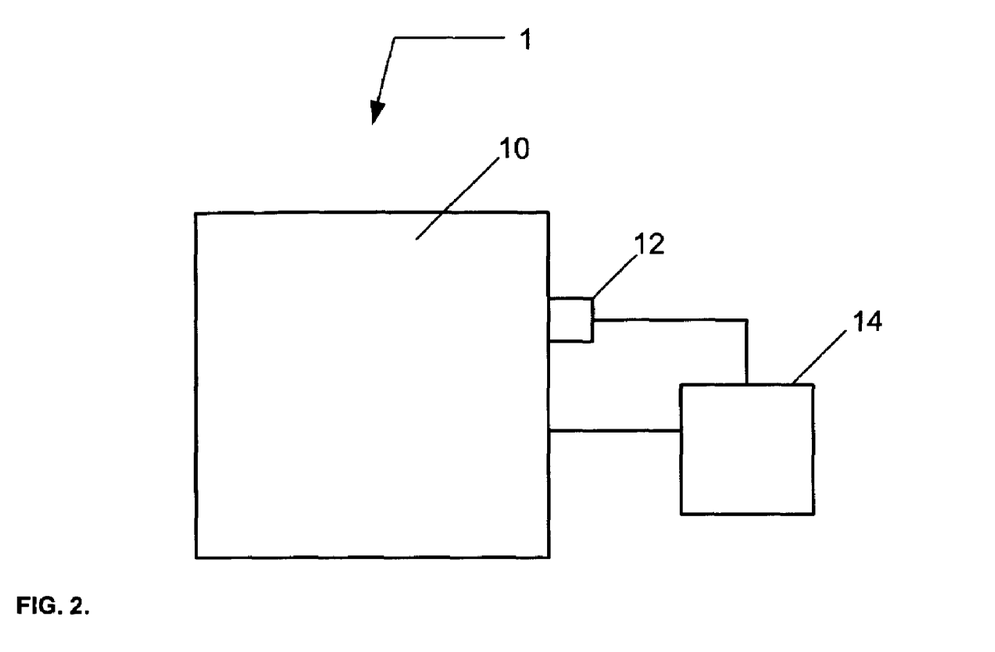
FIG. 2 shows a simplified schematic diagram of a plasma processing system according to an embodiment of the present invention.

According to one embodiment, a plasma processing system 1 is depicted in FIG. 2 comprising a plasma processing chamber 10, a diagnostic system 12 coupled to the plasma processing chamber 10, and a controller 14 coupled to the diagnostic system 12 and the plasma processing chamber 10. The controller 14 is configured to execute a process recipe comprising at least one of the above-identified chemistries (i.e., $NH_3/O_2$, $N_2/H_2/O_2$, $NH_3/CO$, $N_2/H_2/CO$, $NH_3/CO_2$, $N_2/H_2/CO_2$, etc.) to remove post-etch residue from a dielectric layer. Additionally, controller 14 is configured to receive at least one endpoint signal from the diagnostic system 12 and to post-process the at least one endpoint signal in order to accurately determine an endpoint for the process. In the illustrated embodiment, plasma processing system 1, depicted in FIG. 2, utilizes a plasma for material processing. Plasma processing system 1 can comprise an etch chamber.

Figure 3:
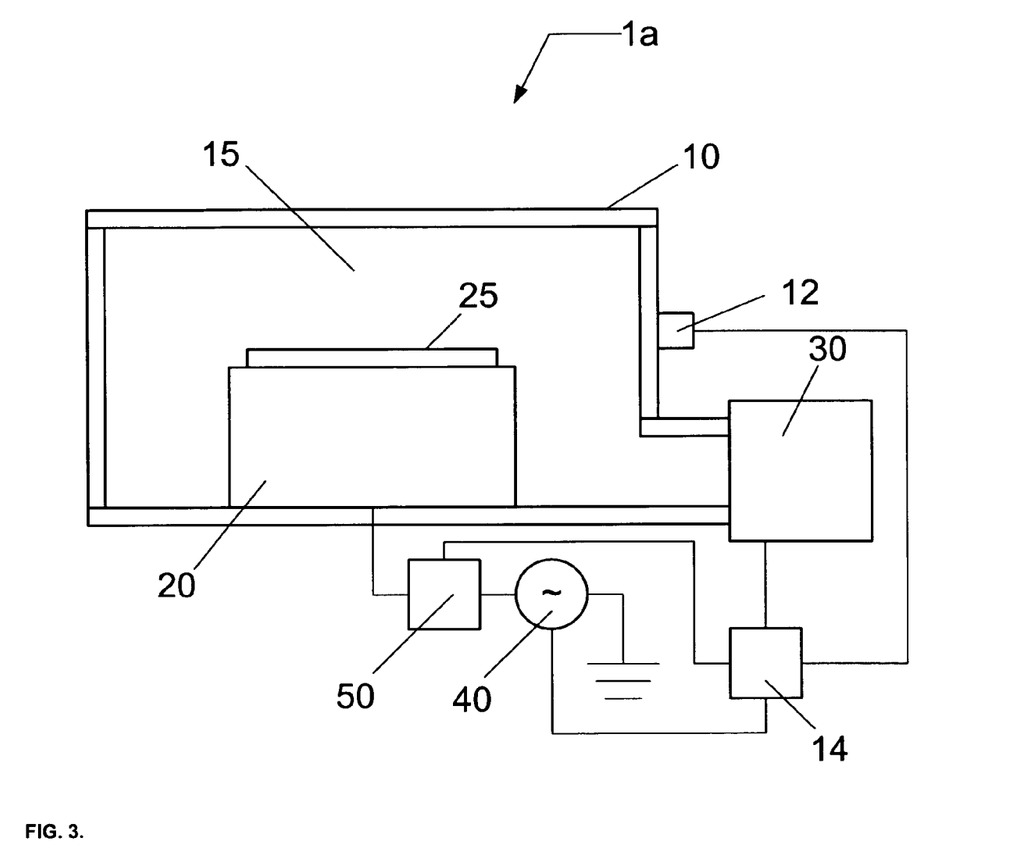
FIG. 3 shows a schematic diagram of a plasma processing system according to another embodiment of the present invention.

According to the embodiment depicted in FIG. 3, plasma processing system 1a can comprise plasma processing chamber 10, substrate holder 20, upon which a substrate 25 to be processed is affixed, and vacuum pumping system 30. Substrate 25 can be, for example, a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process substrates of any size such as 200 mm substrates, 300 mm substrates, or larger.

Substrate 25 can be affixed to the substrate holder 20 via an electrostatic clamping system. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 25. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, pi-type, T-type, etc.) and automatic control methods are well known to those skilled in the art.

Vacuum pump system 30 can, for example, include a turbo-molecular vacuum pump (TMP) capable of a pumping speed of 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 comprises a microprocessor, memory, and a digital I/O port capable of generating control voltages sufficient to communicate with and activate inputs to plasma processing system 1a as well as monitor outputs from plasma processing system 1a. Moreover, controller 14 can be coupled to and can exchange information with RF generator 40, impedance match network 50, the gas injection system (not shown), vacuum pump system 30, as well as the backside gas delivery system (not shown), the substrate/substrate holder temperature measurement system (not shown), and/or the electrostatic clamping system (not shown). For example, a program stored in the memory can be utilized to activate the inputs to the aforementioned components of plasma processing system 1a according to a process recipe in order to perform the method of etching an organic ARC layer. One example of controller 14 is a DELL PRECISION WORKSTATION 610™, available from Dell Corporation, Austin, Tex.

Controller 14 may be locally located relative to the plasma processing system 1a, or it may be remotely located relative to the plasma processing system 1a via an internet or intranet. Thus, controller 14 can exchange data with the plasma processing system 1a using either a direct connection, an intranet, or the internet, or any combination thereof. Controller 14 may be coupled to an intranet at a customer site (i.e., a device maker, etc.), or coupled to an intranet at a vendor site (i.e., an equipment manufacturer). Furthermore, another computer (i.e., controller, server, etc.) can access controller 14 to exchange data via either a direct connection, an intranet, or the internet, or any combination thereof.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include a line CCD (charge coupled device), a CID (charge injection device) array, or a light dispersing device such as a grating or a prism, or any combination thereof. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single or bundled optical fibers, where the light output from the optical fibers is dispersed across the line CCD array using a fixed grating. With the configuration described above, light transmitted through an optical vacuum window can be focused onto the input end of the optical fibers via a convex spherical lens. Three spectrometers, each specifically tuned for a given spectral range (UV, VIS and NIR), form a sensor for the process chamber 10. Each spectrometer includes an independent A/D converter. And lastly, depending upon the sensor utilization, a full emission spectrum can be recorded every 0.1 to 1.0 seconds.

Figure 4:
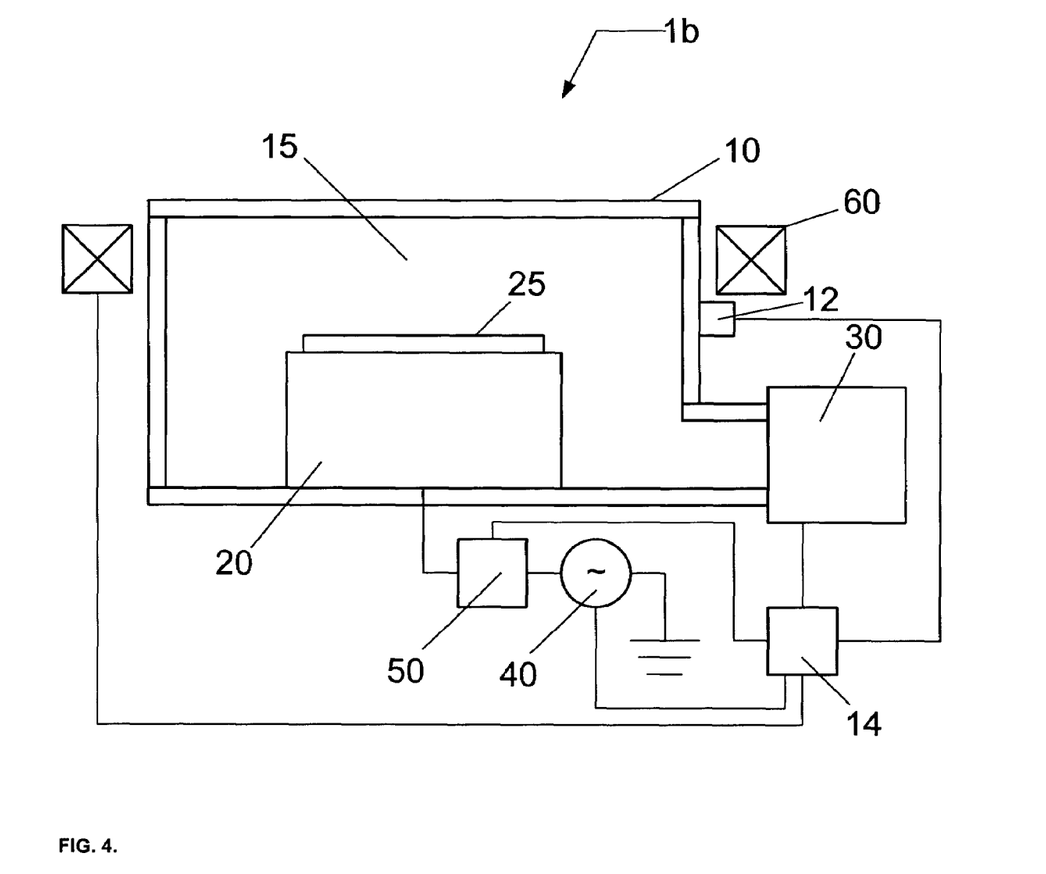
FIG. 4 shows a schematic diagram of a plasma processing system according to another embodiment of the present invention.

In the embodiment shown in FIG. 4, the plasma processing system 1b can be similar to the embodiment of FIG. 2 or 3 and further comprise either a stationary, or mechanically or electrically rotating magnetic field system 60, in order to potentially increase plasma density and/or improve plasma processing uniformity, in addition to those components described with reference to FIG. 2 and FIG. 3. Moreover, controller 14 can be coupled to magnetic field system 60 in order to regulate the speed of rotation and field strength. The design and implementation of a rotating magnetic field is well known to those skilled in the art.

Figure 5:
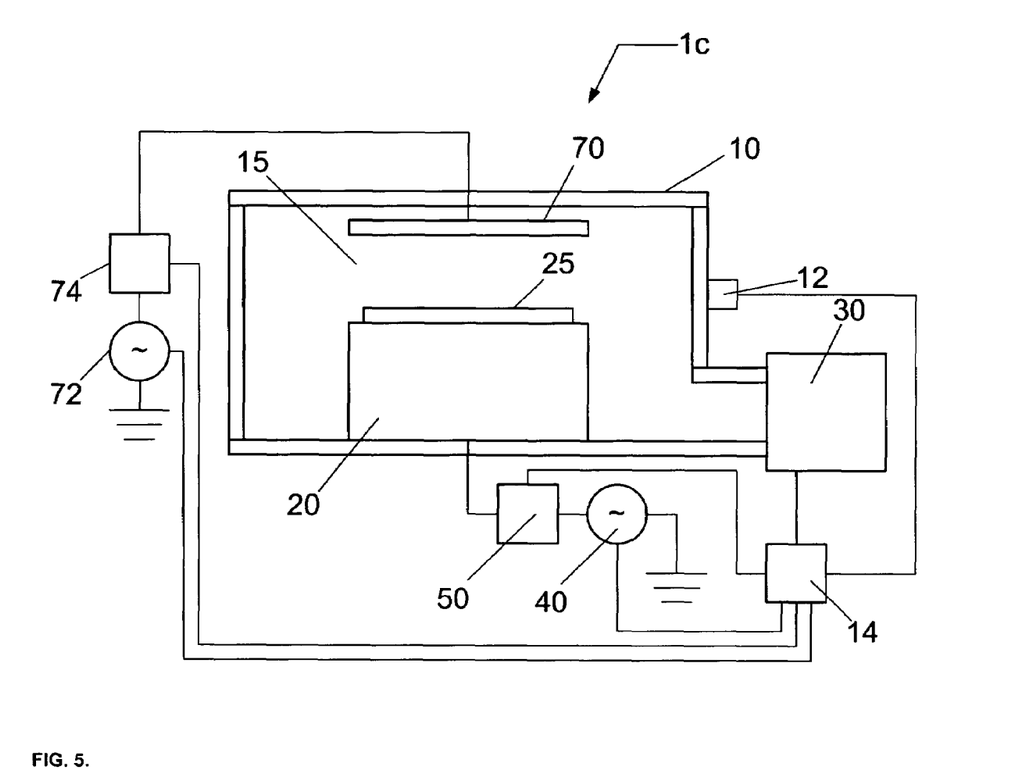
FIG. 5 shows a schematic diagram of a plasma processing system according to another embodiment of the present invention.

In the embodiment shown in FIG. 5, the plasma processing system 1c can be similar to the embodiment of FIG. 2 or FIG. 3, and can further comprise an upper electrode 70 to which RF power can be coupled from RF generator 72 through impedance match network 74. A typical frequency for the application of RF power to the upper electrode can range from about 0.1 MHz to about 200 MHz. Additionally, a typical frequency for the application of power to the lower electrode can range from about 0.1 MHz to about 100 MHz. Moreover, controller 14 is coupled to RF generator 72 and impedance match network 74 in order to control the application of RF power to upper electrode 70. The design and implementation of an upper electrode is well known to those skilled in the art.

Figure 6:
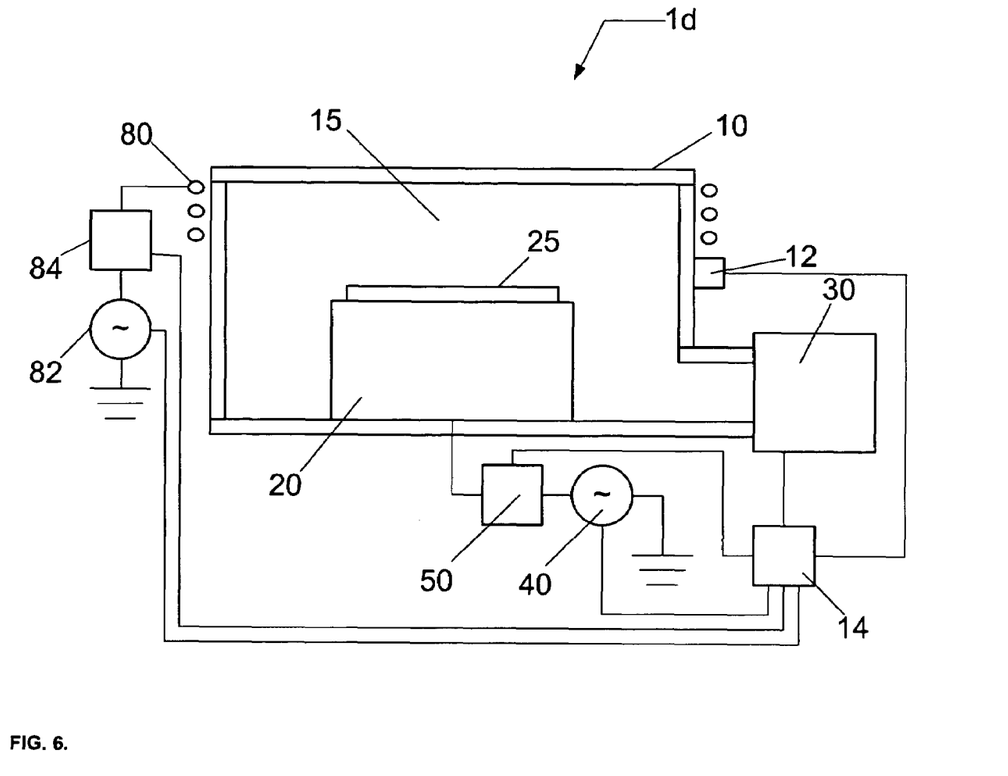
FIG. 6 shows a schematic diagram of a plasma processing system according to another embodiment of the present invention.

In the embodiment shown in FIG. 6, the plasma processing system 1d can be similar to the embodiments of FIGS. 2 and 3, and can further comprise an inductive coil 80 to which RF power is coupled via RF generator 82 through impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, a method of removing post-etch residue from a dielectric layer utilizing a plasma processing device is presented. The plasma processing device can comprise various elements, such as described with respect to FIGS. 2 through 6, or combinations thereof.

In one embodiment, a method of removing post-etch residue from a dielectric layer comprises an $NH_3/CO$ based chemistry. For example, a process parameter space can comprise a chamber pressure of about 20 to about 1000 mTorr, an $NH_3$ process gas flow rate ranging from about 50 to about 2000 sccm, a CO process gas flow rate ranging from about 50 to about 1000 sccm, an upper electrode (e.g., element 70 in FIG. 5) RF bias ranging from about 0 to about 2000 W, and a lower electrode (e.g., element 20 in FIG. 5) RF bias ranging from about 10 to about 1000 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another embodiment, the method of removing post-etch residue from a dielectric layer comprises an $NH_3/O_2$ based chemistry. For example, a process parameter space can comprise a chamber pressure of about 20 to about 1000 mTorr, an $NH_3$ process gas flow rate ranging from about 50 to about 2000 sccm, an $O_2$ process gas flow rate ranging from about 50 to about 1000 sccm, an upper electrode (e.g., element 70 in FIG. 5) RF bias ranging from about 0 to about 2000 W, and a lower electrode (e.g., element 20 in FIG. 5) RF bias ranging from about 10 to about 1000 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In yet another embodiment, the method of removing post-etch residue from a dielectric layer comprises an $NH_3/CO_2$ based chemistry. For example, a process parameter space can comprise a chamber pressure of about 20 to about 1000 mTorr, an $NH_3$ process gas flow rate ranging from about 50 to about 2000 sccm, an $CO_2$ process gas flow rate ranging from about 50 to about 1000 sccm, an upper electrode (e.g., element 70 in FIG. 5) RF bias ranging from about 0 to about 2000 W, and a lower electrode (e.g., element 20 in FIG. 5) RF bias ranging from about 10 to about 1000 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In one example, a method of removing post-etch residue from a dielectric layer utilizing a plasma processing device such as the one described in FIG. 5 is presented. However, the methods discussed are not to be limited in scope by this exemplary presentation. Table I presents the critical dimensions (CD) (top, middle and bottom) (m, nanometers) of a feature etched in a (SiCOH low-k) dielectric layer following the removal of the post-etch residue and the shift (CD shift) (nm) in critical dimensions of the feature from prior to the removal to following the removal of the post-etch residue utilizing the following exemplary process recipe: Chamber pressure=about 400 mTorr; Upper electrode RF power=about 0 W; Lower electrode RF power=about 300 W; Process gas flow rate $NH_3/CO$=about 1200/600 sccm; a spacing of about 60 mm between the lower surface of electrode 70 (see FIG. 5) and the upper surface of substrate 25 on substrate holder 20; Lower electrode temperature (e.g., substrate holder 20 in FIG. 5)=about 20° C.; Upper electrode temperature (e.g., electrode 70 in FIG. 5)=about 60° C.; Chamber wall temperature=about 60° C.; Backside helium pressure Center/Edge=about 10/35 Torr; and an etch time of about 125 seconds. The critical dimensions and shift in critical dimensions are provided for nested features (closely spaced features) and isolated features (widely spaced features).

Additionally, the critical dimensions and shift in critical dimensions are provided for two other process recipes for removing post-etch residue from a dielectric layer. Firstly, a conventional oxygen ($O_2$) based chemistry is provided:

Chamber pressure=about 20 mTorr; Upper electrode RF power=about 300 W; Lower electrode RF power=about 0 W; Process gas flow rate $O_2$/Ar=about 200/550 sccm; a spacing of about 60 mm between the lower surface of electrode 70 (see FIG. 5) and the upper surface of substrate 25 on substrate holder 20; Lower electrode temperature (e.g., substrate holder 20 in FIG. 5)=about 20° C.; Upper electrode temperature (e.g., electrode 70 in FIG. 5)=about 60° C.; Chamber wall temperature=about 60° C.; Backside helium pressure Center/Edge=about 10/35 Torr; and an etch time of about 55 seconds. Secondly, an ammonia ($NH_3$) based chemistry is provided: Chamber pressure=about 400 mTorr; Upper electrode RF power=about 0 W; Lower electrode RF power=about 300 W; Process gas flow rate $NH_3$=about 1800 sccm; a spacing of about 60 mm electrode spacing between the lower surface of electrode 70 (see FIG. 5) and the upper surface of substrate 25 on substrate holder 20; Lower electrode temperature (e.g., substrate holder 20 in FIG. 5)=about 20° C.; Upper electrode temperature (e.g., electrode 70 in FIG. 5)=about 60° C.; Chamber wall temperature=about 60° C.; Backside helium pressure Center/Edge=about 10/35 Torr; and an etch time of about 120 seconds.

TABLE I

| Chemistry | Location | CD Top | CD Middle | CD Bottom | CD Shift Top | CD Shift Middle | CD Shift Bottom |
|---|---|---|---|---|---|---|---|
| | | | NESTED | | | | |
| $O_2$ | Center | 121 | 159 | 99 | 4 | 52 | 17 |
| | Edge | 121 | 169 | 105 | 3 | 57 | 13 |
| $NH_3$ | Center | 116 | 110 | 96 | 1 | 7 | 7 |
| | Edge | 113 | 107 | 87 | 7 | 11 | 11 |
| $NH_3$ + CO | Center | 121 | 118 | 98 | 4 | 3 | 5 |
| | Edge | 116 | 112 | 90 | 3 | 3 | 5 |
| | | | ISOLATED | | | | |
| $O_2$ | Center | 123 | 171 | 101 | 2 | 50 | 13 |
| | Edge | 140 | 190 | 138 | 5 | 59 | 39 |
| $NH_3$ | Center | 125 | 113 | 105 | 6 | 14 | 8 |
| | Edge | 133 | 123 | 109 | 2 | 10 | 10 |
| $NH_3$ + CO | Center | 136 | 132 | 110 | 7 | 5 | 5 |
| | Edge | 134 | 122 | 100 | 3 | 7 | 9 |

As shown in Table I, the CD shift is markedly reduced when the ammonia ($NH_3$) based chemistry with CO is utilized. For instance, the CD shift for nested features is less than or equal to 5 nm, and the CD shift for isolated features is less than 10 nm. Also, the shift in the critical dimension can be not more than approximately 10% of the critical dimension. Although the CD shift for the ammonia only based chemistry is reasonable, the inventors have recognized that the removal of the post-etch residue using this chemistry has caused excessive removal of the etch stop layer underlying the (low-k) dielectric layer.

Figure 7:
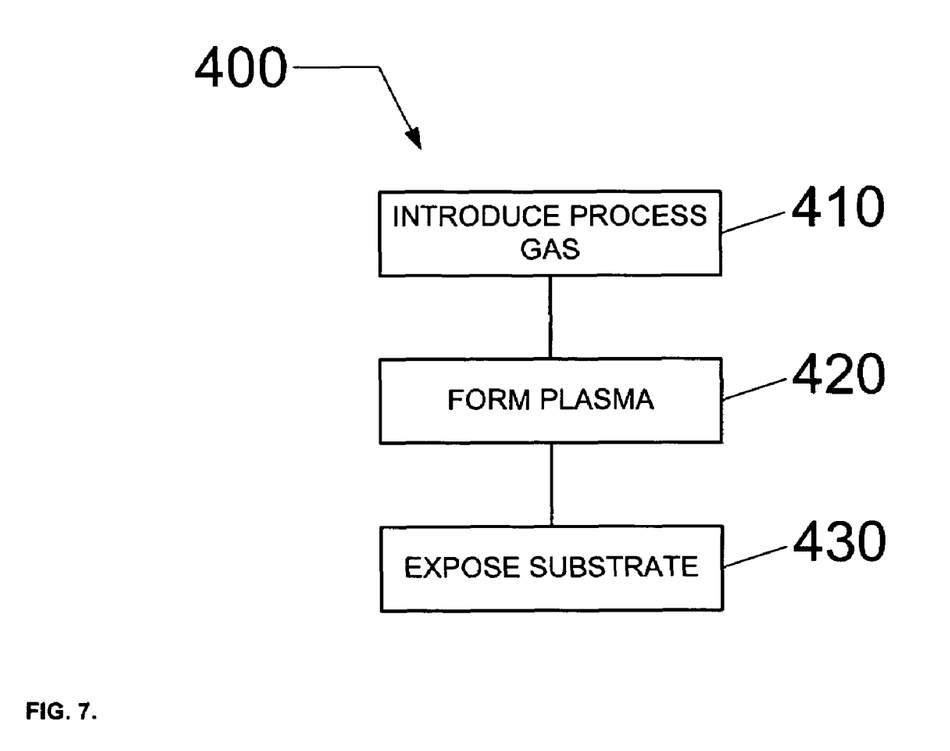
FIG. 7 presents a method of removing post-etch residue from a dielectric layer on a substrate in a plasma processing system according to an embodiment of the present invention.

FIG. 7 presents a flow chart of a method for removing post-etch residue from a (low-k) dielectric layer on a substrate in a plasma processing system according to an embodiment of the present invention. Procedure 400 begins in 410 in which a process gas is introduced to the plasma processing system, wherein the process gas comprises a nitrogen (N) containing gas, a hydrogen (H) containing gas, and an oxygen (O) containing gas. For example, the process gas can comprise ammonia ($NH_3$), and diatomic oxygen ($O_2$). Alternately, the process gas can comprise diatomic nitrogen ($N_2$), diatomic hydrogen ($H_2$), and diatomic oxygen ($O_2$). Alternately, the process gas can comprise ammonia ($NH_3$), and carbon monoxide (CO). Alternately, the process gas can comprise diatomic nitrogen ($N_2$), diatomic hydrogen ($H_2$), and carbon monoxide (CO). Alternately, the process gas can comprise ammonia ($NH_3$), and carbon dioxide ($CO_2$). Alternately, the process gas can comprise diatomic nitrogen ($N_2$), diatomic hydrogen ($H_2$), and carbon dioxide ($CO_2$). Alternately, the process gas can further comprise an inert gas, such as a noble gas.

In 420, a plasma is formed in the plasma processing system from the process gas using, for example, any of the systems described in FIGS. 2 through 6, or combinations thereof.

In 430, the substrate comprising the dielectric layer having post-etch residue thereon is exposed to the plasma formed in 420 in order to remove the post-etch residue without damaging the dielectric layer. In this embodiment, the exposure to the plasma can reduce the thickness of an etch stop layer underlying the dielectric layer by less than approximately 10%.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of removing post-etch residue from a substrate, comprising:
    disposing said substrate having a dielectric layer in a plasma processing system, wherein said dielectric layer has a feature formed therein using an etching process and said feature has said post-etch residue formed thereon by said etching process, and wherein said dielectric layer has a dielectric constant value less than the dielectric constant of $SiO_2$, wherein said disposing of said substrate having said dielectric layer comprises disposing said substrate having said dielectric layer with an etch stop layer underlying said dielectric layer;
    introducing a process gas comprising a nitrogen containing gas, a hydrogen containing gas, and an oxygen containing gas, wherein said oxygen containing gas comprises CO and/or $CO_2$;
    forming a plasma from said process gas in said plasma processing system; and
    exposing said substrate to said plasma in order to remove said post-etch residue, while causing an insubstantial change in said dielectric constant value of said dielectric layer, wherein said exposing of said substrate to said plasma causes a loss of said etch stop layer of less than approximately 10% of the thickness of said etch stop layer.

2. The method of claim 1, wherein said oxygen containing gas further comprises oxygen ($O_2$).

3. The method of claim 1, wherein said introducing of said process gas further comprises introducing an inert gas.

4. The method of claim 3, wherein said introducing of said inert gas comprises introducing a noble gas.

5. The method of claim 1, wherein said introducing of said nitrogen containing gas and said hydrogen containing gas comprises introducing ammonia ($NH_3$).

6. The method of claim 1, wherein said introducing of said nitrogen containing gas and said hydrogen containing gas comprises introducing nitrogen ($N_2$) and hydrogen ($H_2$).

7. The method of claim 1, wherein said introducing of said process gas comprises introducing $NH_3$ and CO.

8. The method of claim 1, wherein said introducing of said process gas comprises introducing $NH_3$ and $O_2$.

9. The method of claim 1, wherein said dielectric layer comprises a porous dielectric layer.

10. The method of claim 1, wherein said dielectric layer has a dielectric constant value less than 2.5.

11. The method of claim 1, wherein said forming of said plasma comprises coupling radio frequency (RF) power to a substrate holder upon which said substrate rests.

12. The method of claim 1, wherein said etch stop layer comprises silicon nitride, or silicon carbide.

* * * * *